(12) United States Patent
Uno

(10) Patent No.: US 6,544,331 B1
(45) Date of Patent: Apr. 8, 2003

(54) CRYSTAL OSCILLATOR AND MANUFACTURING METHOD THEREOF

(75) Inventor: Takehiko Uno, Tokyo (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/313,763

(22) Filed: May 18, 1999

Related U.S. Application Data

(62) Division of application No. 08/788,814, filed on Jan. 23, 1997, now Pat. No. 5,955,825.

(30) Foreign Application Priority Data

Apr. 26, 1996 (JP) ............................................. 8-108300

(51) Int. Cl.⁷ ................................................. C30B 1/00
(52) U.S. Cl. ........................... 117/7; 117/10; 117/943; 331/73; 331/139
(58) Field of Search ................................. 117/7, 943, 8, 117/10, 104, 938; 331/73, 139, 158; 310/311, 315, 360, 361, 366

(56) References Cited

U.S. PATENT DOCUMENTS

| | | | |
|---|---|---|---|
| 3,614,482 A | 10/1971 | Glanc | 310/315 |
| 4,219,754 A | 8/1980 | Hoshi et al. | 310/315 |
| 4,317,059 A | 2/1982 | Besson | 310/361 |
| 4,344,010 A | 8/1982 | Vig et al. | 310/315 |
| 4,365,182 A | 12/1982 | Ballato et al. | 310/361 |
| 4,410,822 A | 10/1983 | Filler | 310/361 |
| 4,568,850 A | 2/1986 | Ballato | 310/361 |
| 4,902,926 A | 2/1990 | Engel et al. | 310/361 |
| 5,057,801 A | 10/1991 | Kittaka et al. | 333/187 |
| 5,132,643 A | 7/1992 | Ueno et al. | 331/163 |
| 5,376,861 A | * 12/1994 | Nakamura et al. | 310/361 |
| 5,406,682 A | * 4/1995 | Zimnicki et al. | 29/25.35 |
| 5,557,968 A | 9/1996 | Krempl et al. | 310/361 |
| 5,574,414 A | 11/1996 | Ogawa et al. | 333/189 |
| 5,668,057 A | * 9/1997 | Eda et al. | 438/113 |
| 6,168,980 B1 | * 1/2001 | Yamazaki et al. | 438/162 |

FOREIGN PATENT DOCUMENTS

JP      0049018      4/1980

* cited by examiner

Primary Examiner—Robert Kunemund
Assistant Examiner—Lan Vinh
(74) Attorney, Agent, or Firm—Armstrong, Westerman & Hattori, LLP

(57) ABSTRACT

A crystal oscillator and method for manufacturing same including excitation electrode portions formed upon a crystal substrate and thus forming an excitation portion of the area defined between the electrode portions. Axis inversion portions possess an electrical axis (−X) opposite to the electrical axis (X) of the excitation portion, these axis inversion portions being formed within the crystal substrate at a position other than that of the excitation portion. A stable resonance frequency and filter frequency can be obtained even under conditions of ambient temperature fluctuation, by means of a relatively simple temperature compensation circuit, wherein handling is easy and no complicated adjustment is necessary, and low costs can be realized.

5 Claims, 7 Drawing Sheets

FIG.2
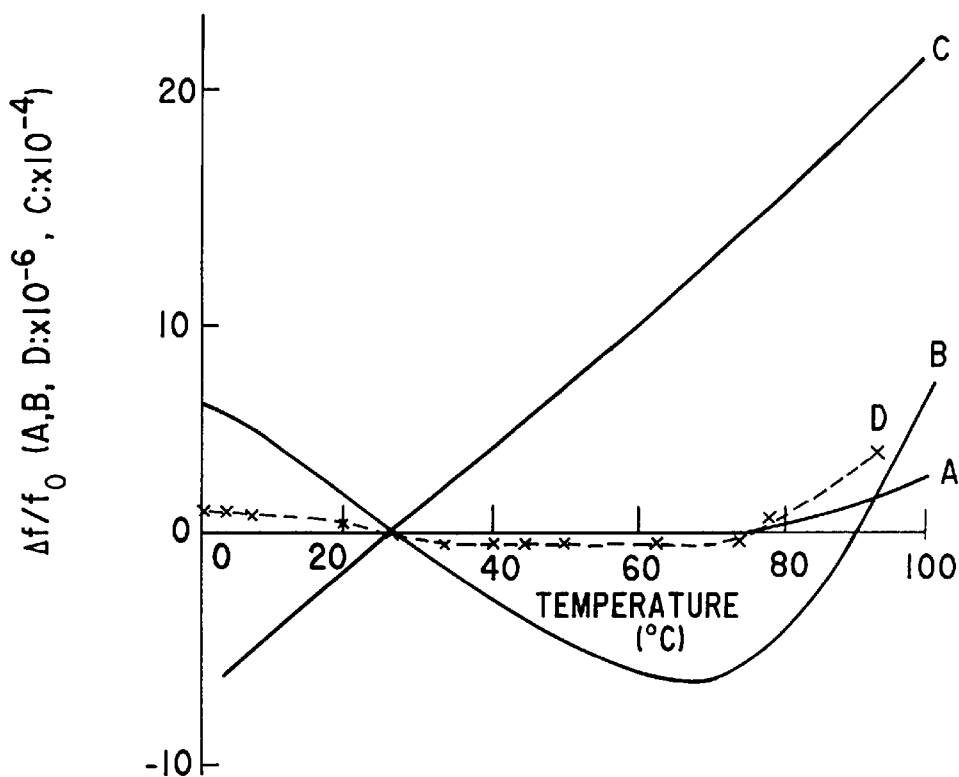
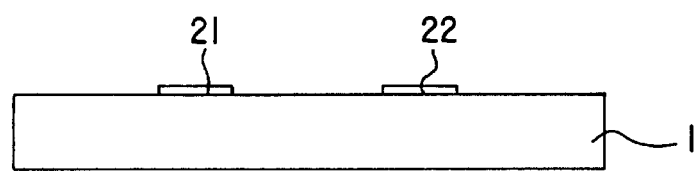
FIG.3(a)
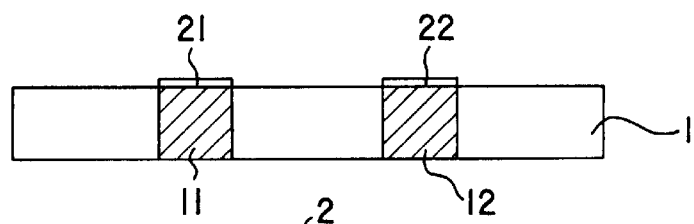
FIG.3(b)
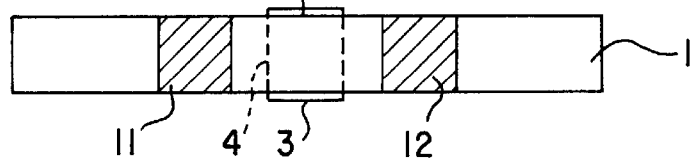
FIG.3(c)

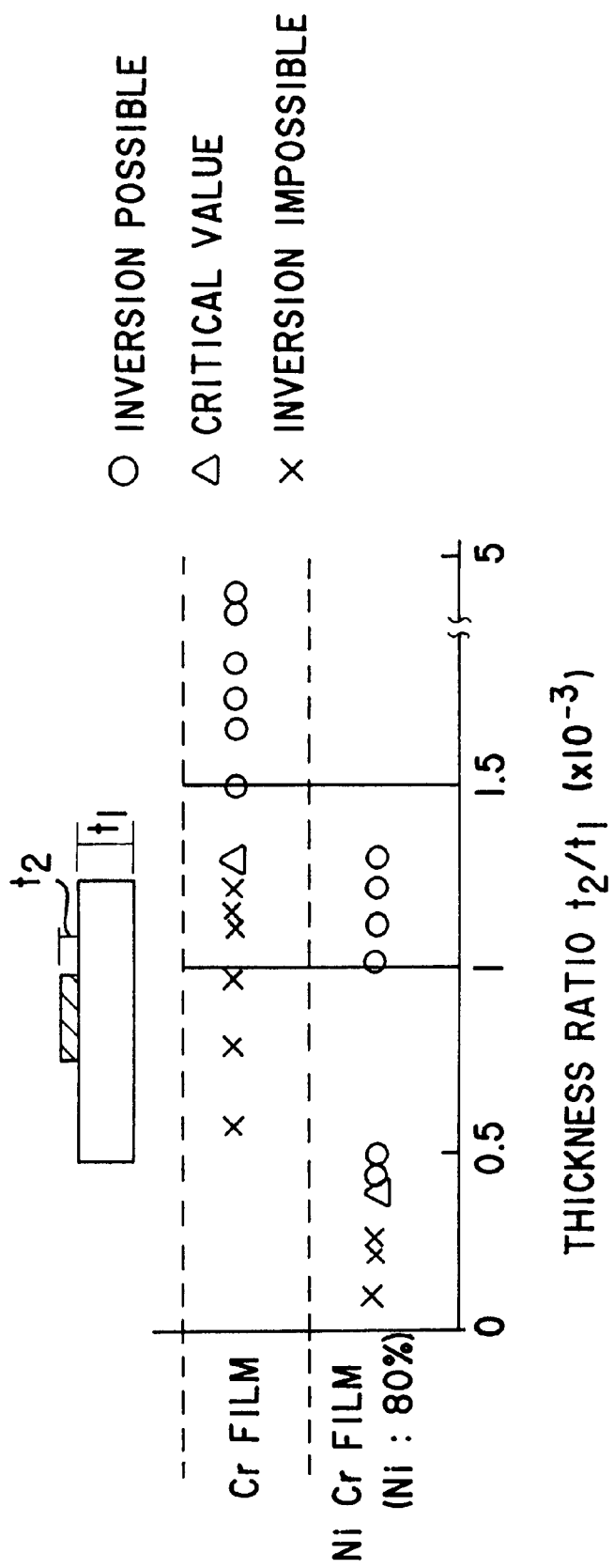

CRYSTAL OSCILLATOR AND MANUFACTURING METHOD THEREOF

This application is a division of prior application Ser. No. 08/788,814 filed Jan. 23, 1997, now U.S. Pat. No. 5,955,825 issued Sep. 21, 1999.

BACKGROUND OF THE INVENTION

1. Field of the Invention

The present invention relates to a crystal oscillator and the manufacturing method thereof, the crystal oscillator preferred for use in computer clock generators local oscillators to, and filters for wireless communication equipment, and the like, with stable resonance frequency and a stable filter frequency being obtained even under conditions of ambient temperature fluctuation.

2. Description of the Related Art

Crystal oscillators which provide a stable resonance frequency during temperature changes have been used in the resonance circuitry of oscillators which generate electrical signals at a certain frequency.

FIG. 11 is a perspective view of a known crystal oscillator. FIG. 11 shows an AT-cut crystal substrate 1 which possesses an electrical axis (X) and wherein the temperature coefficient of the frequency is 0, electrode portions 2, 3 for excitation comprised of aluminum, gold, or the like, formed on both sides of the crystal substrate, and an excitation portion 4 which is the box-shaped area defined between the electrode portions 2 and 3.

This crystal oscillator is capable of generating electrical oscillation of a natural frequency within a range of around 1 kHz to 100 MHz, by means of applying a high-frequency voltage approximating a resonance frequency to the electrode portions 2 and 3.

Now, the resonance frequency of the above-described crystal oscillator possesses properties described by a curve of the third order in the event that the ambient temperature is employed as a parameter. Consequently, fluctuation in the resonance frequency is negligible when temperature fluctuation is small, but in the case where the temperature fluctuation is great, fluctuation in the resonance frequency becomes objectionably large.

Accordingly, temperature sensing devices which can provide a temperature compensating voltage to counteract this characteristic have been provided. An example is the Temperature Compensated X'tal Oscillator (TCXO) wherein the resonance frequency thereof is changed in a manner generally linear with the change in ambient temperature, by means of combining with a temperature compensating circuit which employs a thermistor described by an exponential function.

Further, generally, existence of a twin crystal within the crystal of the electronic device has adverse effects upon the properties of the device, and accordingly, it is considered to be imperative that there is no twin crystal formation within the afore-mentioned crystal. Also, it is well-known that there is no twin crystal formation within the crystal substrate used as the oscillator of the afore-mentioned crystal oscillator or the like.

However, there are various problems with the above-described crystal oscillator (TCXO), such as an increase in cost resulting from the additional electronic components required in forming the temperature compensating circuit in addition to the afore-mentioned thermistor; complicated procedures required for adjustment of the circuit, and the like.

On the other hand, it had been thought that the resonance frequency/temperature properties of the crystal substrate described by a curve of the third order were properties inherent to the crystal substrate, with no improvement to the crystal substrate itself possible.

Accordingly, the present invention is directed to solving the afore-mentioned problems, and the object thereof is to provide a crystal oscillator wherein a stable resonance frequency and a stable filter frequency can be obtained even under conditions of ambient temperature fluctuation, by means of a relatively simple temperature compensation circuit, wherein handling is easy and no complicated adjustment is necessary, and further wherein low costs can be realized, and also to provide a method for manufacturing such a crystal oscillator.

SUMMARY OF THE INVENTION

A crystal exhibits α-β phase transition at 573° C. (Tc), but the transition temperature decreases due to stress and the like, and it is known that the electrical axis (X-axis) is inverted at temperatures below Tc.

The inventors have discovered that applying metal electrode portions to the surface of the crystal substrate and providing heat treatment causes inversion of the axis of the crystal plate at temperatures far below Tc, depending on the direction of cut and the type of metal. The inventors thereby have provided a crystal oscillator with the crystal substrate provided with an axis inversion portion possessing an electrical axis opposite to the electrical axis of the excitation portion, and a manufacturing method thereof.

Accordingly, the crystal oscillator according to the present invention comprises: a crystal substrate; and electrode portions for excitation formed on either face of the crystal substrate so as to form an excitation portion of the area defined between the electrode portions, wherein an axis inversion portion possessing an electrical axis opposite to the electrical axis of the excitation portion is formed within the crystal substrate at a position other than that of the excitation portion.

Because this crystal oscillator has been provided with an axis inversion portion possessing an electrical axis opposite to the electrical axis of the excitation portion, temperature compensation is performed by causing leakage of a portion of the oscillation energy generated within the afore-mentioned excitation portion to the afore-mentioned axis inversion portion. For example, an AT-cut crystal substrate has a resonance frequency which possesses negative temperature properties at room temperature, whereas the afore-mentioned axis inversion portion has a resonance frequency which possesses positive temperature properties. Thus, the temperature properties of the excitation portion are compensated by means of the afore-mentioned axis inversion portion. Consequently, a stable resonance frequency can be obtained even under conditions of ambient temperature fluctuation by means of a relatively simple temperature compensation circuit.

The crystal oscillator may have an axis inversion portion formed adjacent to at least one side of the excitation portion.

The crystal oscillator may have an axis inversion portion formed in the periphery of the excitation portion.

Because the axis inversion portions of these crystal oscillators are formed adjacent to at least one side of the excitation portion or in the periphery thereof, temperature compensation is corried out in a more precise manner by causing leakage of a portion of the oscillation energy generated within the afore-mentioned excitation portion to the afore-mentioned axis inversion portion.

The crystal oscillator may have electrode portions for excitation provided on the axis inversion portion so as to form a temperature sensor portion.

According to this crystal oscillator, the afore-mentioned axis inversion portion serves as a temperature sensor having temperature coefficients in a generally linear manner. Accordingly, applying this oscillator to known crystal oscillators (TCXO) permits obtaining of temperature information of the crystal substrate directly, thus enabling temperature compensation with a high degree of precision.

The method for manufacturing a crystal oscillator according to the present invention includes a crystal substrate and electrode portions for excitation formed on either face of the crystal substrate so as to form an excitation portion of the area defined between the electrode portions, the manufacturing method comprising the steps of: forming metal film on at least one side of the electrode portions for excitation formed on the surface of the crystal substrate; and subsequently subjecting the crystal substrate to thermal treatment at a temperature equal to or below the α-β transition temperature of the crystal, thus forming within the crystal substrate an axis inversion portion possessing an electrical axis opposite to the electrical axis of the excitation portion.

According to this manufacturing method, the crystal substrate upon which metal film is formed is subjected to thermal treatment at a temperature equal to or below the α-β transition temperature of the crystal, thus causing inversion of the electrical axis at the position within the crystal substrate at which the inversion portion should be formed, at a temperature below the α-β transition temperature, due to stress caused by the afore-mentioned metal film. Accordingly, an axis inversion portion possessing an electrical axis opposite to the electrical axis of the excitation portion is formed within the crystal substrate at a position other than that of the afore-mentioned excitation portion, and thus a twin crystal structure including the afore-mentioned axis inversion portion and the afore-mentioned excitation portion is formed within the crystal substrate.

Consequently, an axis inversion portion possessing an electrical axis opposite to the electrical axis of the excitation portion is formed within the crystal substrate at a position other than that of the afore-mentioned excitation portion, and thus a crystal oscillator can be manufactured wherein a stable resonance frequency and a filter frequency can be obtained even under conditions of ambient temperature fluctuation.

The method for manufacturing a crystal oscillator preferably includes a metal film consisting of one of the following: Cr film, Ni film, or NiCr film.

According to this manufacturing method, inversion of the electrical axis occurs at temperatures around 540° C. to 550° C. Consequently, α-β transition can be caused at a temperature far below the α-β transition temperature, when any one of a Cr film, Ni film, or NiCr film is used.

The method for manufacturing a crystal oscillator includes a thermal treatment which is conducted within either an atmosphere of inert gas or within a vacuum.

BRIEF DESCRIPTION OF THE DRAWINGS

FIG. 2 is a graph illustrating the resonance frequency/temperature properties of the crystal oscillator according to the first embodiment of the present invention.

FIGS. 3(a), 3(b) and 3(c) illustrate the process of the method of manufacturing the crystal oscillator according to the first embodiment of the present invention.

FIG. 4 is a diagram illustrating the dependency of axis inversion on film thickness.

DESCRIPTION OF THE PREFERRED EMBODIMENTS

Figure 1A:
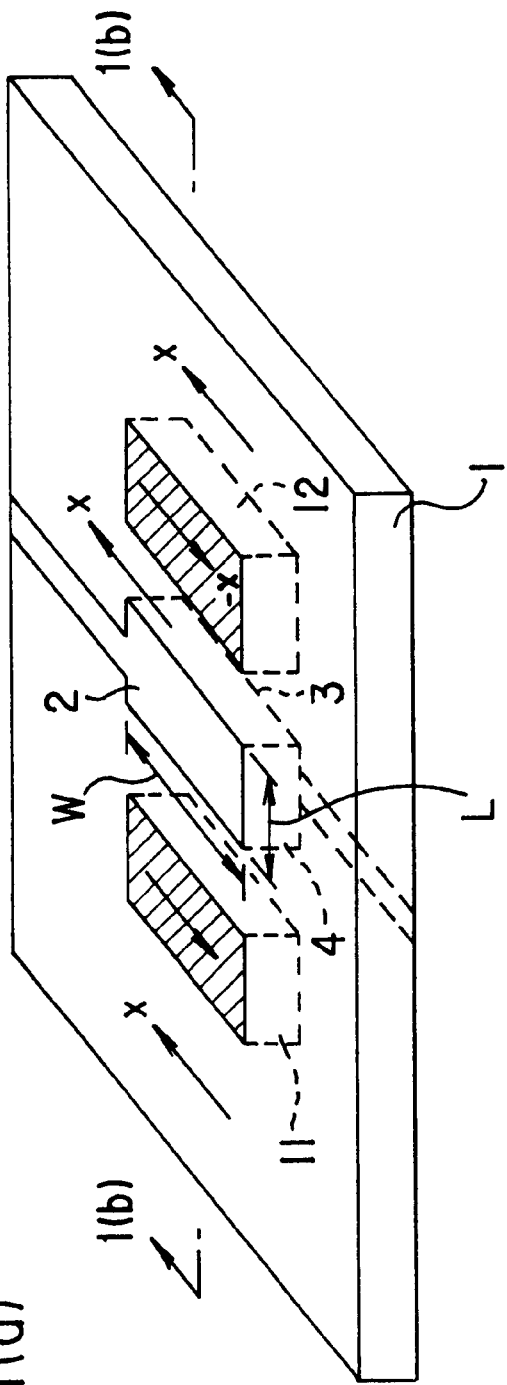
FIGS. 1(a) and 1(b) illustrate a first embodiment according to the present invention, with FIG. 1(a) being a perspective view, and FIG. 1(b) being a cross-sectional view along line 1(b)—1(b) in FIG. 1(a).
Figure 1B:
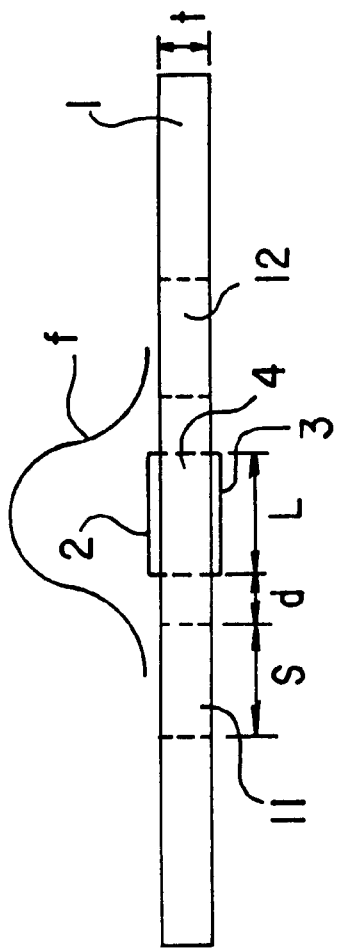

FIGS. 1(a) and (b) illustrate a first embodiment according to the present invention, with FIG. 1(a) being a perspective view, and FIG. 1(b) being a cross-sectional view taken along line 1(b)—1(b) in FIG. 1(a). Also in FIGS. 1(a) and 1(b), reference numerals 11 and 12 denote axis inversion portions possessing an electrical axis (−X) opposite to the electrical axis (X) of the excitation portion, these axis inversion portions being formed adjacent to the excitation portion on either side thereof.

Further, in FIGS. 1(a) and 1(b), W denotes the width of electrodes 2 and 3, L denotes the length of the electrodes 2 and 3, d denotes the spacing between the excitation portion 4 and the axis inversion portions 11 and 12, t denotes the thickness of the crystal substrate 1, s denotes the length of the axis inversion portions 11 and 12, and f denotes the amplitude distribution of oscillating displacement in the longitudinal direction.

With this crystal oscillator, applying a high-frequency voltage approximating a resonance frequency to the electrode portions 2 and 3 results in an amplitude distribution of oscillating displacement f as shown in FIG. 1(b), i.e., a great portion of the energy is concentrated in the excitation portion 4 due to the energy containment effect based on the mass addition effect of the electrode portions 2 and 3, but a portion of the energy leaks and reaches the axis inversion portions 11 and 12, thus improving the temperature properties.

Now, description will be made with reference to FIG. 2 regarding the improvement effects of the temperature properties of the crystal oscillator according to the present embodiment.

In FIG. 2, A denotes optimal properties of the crystal oscillator according to the present embodiment, B denotes properties of an AT-cut crystal oscillator without an axis inversion portion, C denotes properties of an AT-cut crystal oscillator wherein the X-axis has been subjected to inversion treatment, and D shows the results of an experiment conducted in order to confirm the temperature compensation principle of the crystal oscillator according to the present embodiment.

The sample used on the afore-mentioned experiment (D) was according to the following figures: t being 205 μM; W, 5.0 mm; L, 2.5 mm; s, 2.5 mm; and d, 2.0 mm. Thermal treatment was conducted at 550° C. for 1 hour 30 minutes, and the frequency fr used for measurement was 8.0 MHz.

As can be clearly seen, the resonance frequency of the AT-cut crystal oscillator (B) possesses properties described by a curve of the third order, and exhibits negative temperature properties at room temperature. On the other hand, the crystal oscillator (C) wherein the X-axis has been subjected to inversion treatment has an extremely great positive coefficient. Accordingly, as shown in FIG. 1(b), a portion of the oscillation energy (the fringe portion of the oscillation amplitude f) is leaked to the axis inversion portions 11 and 12, thus mutually offsetting the positive temperature coefficient and the negative temperature coefficient, consequently obtaining optical properties (A), i.e., the temperature coefficient thereof becomes approximately 0 within the temperature range of 0 to 75° C., and increases slightly in accordance with rise in temperature above 70° C.

As described above, compensation of temperature properties can be conducted by means of leaking a portion of the oscillation energy to the axis inversion portions 11 and 12, thus mutually offsetting the positive temperature coefficient and negative temperature coefficient. Consequently, a stable resonance frequency can be obtained even under conditions of ambient temperature fluctuation, even without employing a temperature compensation circuit.

Next, the method of manufacturing the crystal oscillator will be described with reference to FIGS. 3(a), 3(b) and 3(c).

First, metal thin films 21 and 22 are formed on the surface of the AT-cut crystal substrate 1 to the portion at which the axis inversion portions 11 and 12 are to be formed, using a method such as electron beam (EB) vapor deposition, the metal thin film being formed of one of the following materials: deviation metals such as Cr or Ni; or an alloy of these such as NiCr, as shown in FIG. 3(a).

Here, it is important that the thickness of the metal films 21 and 22 (t2) be at a certain ratio as compared to the thickness of the crystal substrate 1 (t1) in order to effectively form the axis inversion portions 11 and 12 within the crystal substrate 1, this ratio being R=t2/t1 or greater.

For example, as shown in FIG. 4, with the case of Cr film, the critical value at which axis inversion becomes possible is around $R=1.3 \times 10^{-3}$, and axis inversion becomes impossible if the ratio does not reach this value. Also, in the case of NiCr film, the critical value at which axis inversion becomes possible is around $R=0.4 \times 10^{-3}$, and axis inversion becomes impossible if the ratio does not reach this value. Accordingly, in the case of NiCr, with the thickness t1 of the crystal substrate 1 at 200 μm, the thickness of the NiCr film needs to be 200 nm or greater ($R \geq 1 \times 10^{-3}$) in order to obtain stable axis inversion. The temperature of film formation here is 200° C.

Next, the crystal substrate 1 upon which has been formed the metal films 21 and 22 is subjected to thermal treatment in either an atmosphere of inert gas such as N2 gas or in a vacuum, at a temperature below the α-β transition temperature of the crystal (573° C.). In the case of the metal films 21 and 22 being formed of NiCr, thermal processing is conducted at 550 to 560° C. for thirty minutes.

Inversion of the electrical axis at the position within the crystal substrate 1 at which the inversion portions 11 and 12 are to be formed is caused at a temperature below the α-β transition temperature, due to stress caused by the afore-mentioned metal films 21 and 22 during thermal treatment. Accordingly, axis inversion portions 11 and 12 possessing an electrical axis (-X) opposite to the electrical axis (X) of the excitation portion 4 are formed within the crystal substrate I at a position other than that of the excitation portion 4, as shown in FIG. 3(b).

Next, the metal film is removed if necessary, and electrodes 2 and 3 are formed on both planes of the crystal substrate 1 by means of, e.g., electron beam (EB) vapor deposition, as shown in FIG. 3(C).

Thus, a crystal oscillator having the amplitude distribution of oscillating displacement f as shown in FIG. 1(b) can be obtained.

Now, description will be made regarding the resonance properties of the crystal oscillator according to the present embodiment before and following thermal treatment.

Figure 5:
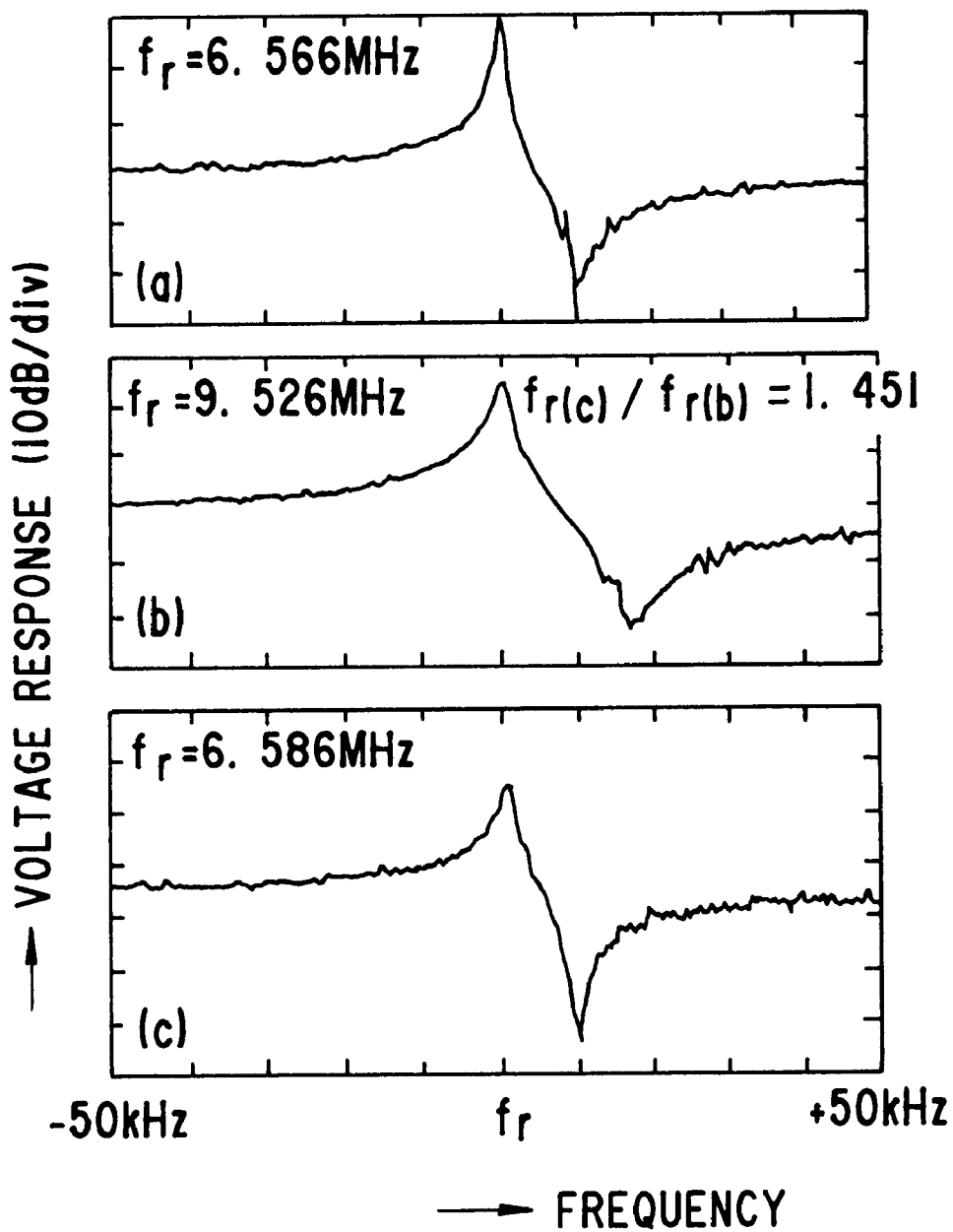
FIG. 5 is a drawing illustrating the resonance properties of the crystal oscillator with metal film before and after undergoing thermal treatment.

FIG. 5 is a drawing illustrating the resonance properties before and following thermal treatment. In the Figure, (a) shows the resonance properties before thermal treatment of a crystal oscillator wherein the Cr film has been formed on both sides of the crystal substrate 1, (b) shows the resonance properties following thermal treatment of the same, and (c) shows the resonance properties following thermal treatment of a crystal oscillator wherein an Al film has been formed on both sides of the crystal substrate 1.

Figure 6:
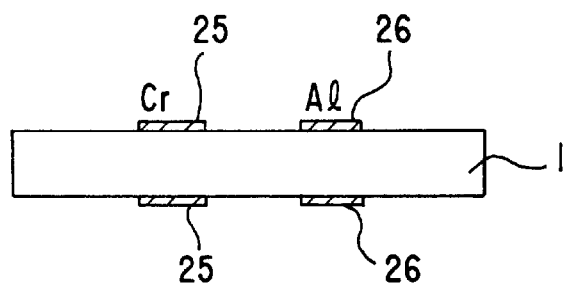
FIG. 6 is a cross-sectional view illustrating the form of the crystal oscillator with metal film.

Here, as shown in FIG. 6, the sample used was a crystal substrate 1 provided with Cr films (metal film) 25 and 25, and Al films (metal film) 26 and 26.

It is clear from (a) and (b) that the resonance frequency of the sample using the Cr films 25 and 25 changes from before and after the thermal treatment, that the frequency ratio before and after the thermal treatment approximately matches the frequency ratio of the crystal substrate 1 (+35° 15' RY-cut) and the axis inversion portion (-35° 15' RY-cut), clearly demonstrating that axis inversion has occurred. On the other hand, there is no clear change in resonance frequency of the sample using the Al films 26 and 26 from before and after the thermal treatment, and thus there is no observed axis inversion.

As described above, according to the crystal oscillator according to the present invention, axis inversion portions 11 and 12 possessing an electrical axis (-X) opposite to the electrical axis (X) of the excitation portion 4 are formed within the crystal substrate 1 at a position adjacent to the excitation portion 4, so that the axis inversion portions 11 and 12 are capable of compensation of the temperature properties of the excitation portion 4, and consequently, temperature compensation is conducted in a more precise manner.

Also, according to the manufacturing method of the crystal oscillator according to the present invention, metal films 21 and 22 are formed on both sides of the surface of the crystal substrate 1 at an area other than that of the excitation portion 4, and the crystal substrate 1 with the metal films 21 and 22 is subsequently subjected to thermal treatment at a temperature equal to or below the α-β transition temperature of the crystal, thus forming within the crystal substrate 1 axis inversion portions 11 and 12 possessing an electrical axis opposite to the electrical axis of the excitation portion 4, and consequently, a crystal oscillator can be manufactured wherein a stable resonance frequency and filter frequency can be obtained even under conditions of temperature fluctuation.

Also, the arrangement of the excitation portion 4 and the axis inversion portions 11 and 12 may be in the aforementioned arrangement of being mutually parallel, or may be in various arrangements such as a comb-shaped arrangement of the horizontal cut-away plane of each plane where the excitation portion 4 and the axis inversion portions 11 and 12 face one another, a comb-shaped arrangement of the upper portion of the horizontal cut-away plane where the excitation portion 4 and the axis inversion portions 11 and 12 face one another with the each of the lower portions being parallel, or otherwise.

Figure 7A:
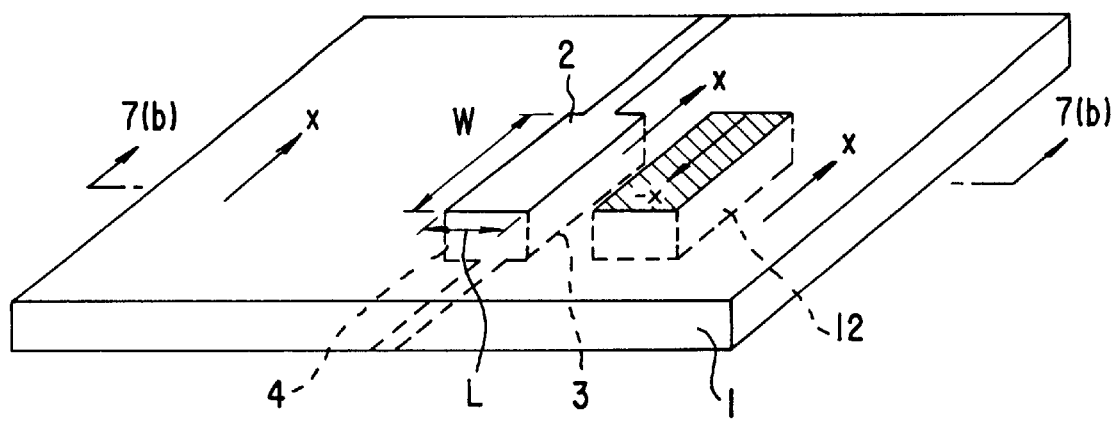
FIGS. 7(a) and 7(b) illustrate a second embodiment according to the present invention, with FIG. 7(a) being a perspective view, and FIG. 7(b) being a cross-sectional view along line 7(b)—7(b) in FIG. 7(a).
Figure 7B:
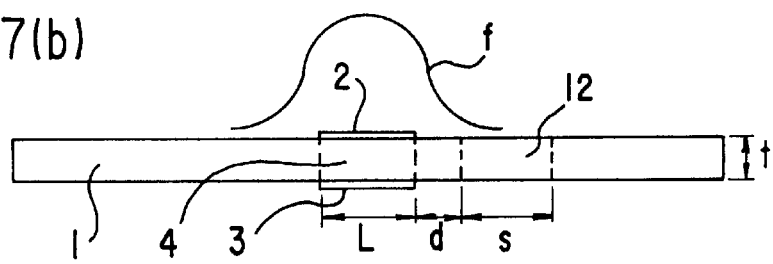

FIGS. 7(a) and 7(b) are drawings illustrating a second embodiment according to the present invention, where FIG. 7(a) is a perspective view, and FIG. 7(b) is a cross-sectional view along line 7(b)—7(b) in FIG. 7(a).

The crystal oscillator according to the present embodiment differs from the crystal oscillator according to the first embodiment in that an axis inversion portion 12 possessing an electrical axis (-X) opposite to the electrical axis (X) of the excitation portion 4 is formed adjacent to the excitation portion 4 on one side thereof within the crystal substrate 1.

With this crystal oscillator, applying a high-frequency voltage approximating the resonance frequency to the electrode portions 2 and 3 results in an amplitude distribution of oscillating displacement f as shown in FIG. 7(b). A large portion of the energy is concentrated in the excitation portion 4 due to the energy containment effect based on the mass addition effect of the electrode portions 2 and 3, but a portion of the energy leaks and reaches the axis inversion portion 12, thus improving the temperature properties.

This crystal oscillator may be manufactured according to the same manufacturing method as that of the above-described crystal oscillator according to the first embodiment.

For example, a metal thin film 22 of NiCr or the like is formed at a thickness of 200 nm or greater on the surface of the AT-cut crystal substrate 1, which is 200 μm in thickness, to the portion thereof at which the axis inversion portion 12 is to be formed, and subsequently the substrate is subjected to thermal treatment for thirty minutes in either an atmosphere of inert gas such as N2 gas or in a vacuum, at a temperature below the α-β transition temperature of the crystal (573° C.), e.g., 550 to 560° C., whereby an axis inversion portion 12 possessing an electrical axis (-X) opposite to the electrical axis (X) of the excitation portion 4 is formed within the crystal substrate 1. Thereby, a crystal oscillator having an amplitude distribution of oscillating displacement f as shown in FIG. 7(b) can be obtained.

Just as with the above-described first embodiment, the crystal oscillator according to the second embodiment is capable of compensating the temperature properties of the excitation portion 4 by means of the afore-mentioned axis inversion portion 12, and consequently, a stable resonance frequency can be obtained even under conditions of ambient temperature fluctuation by means of a relatively simple temperature compensation circuit.

Figure 8A:
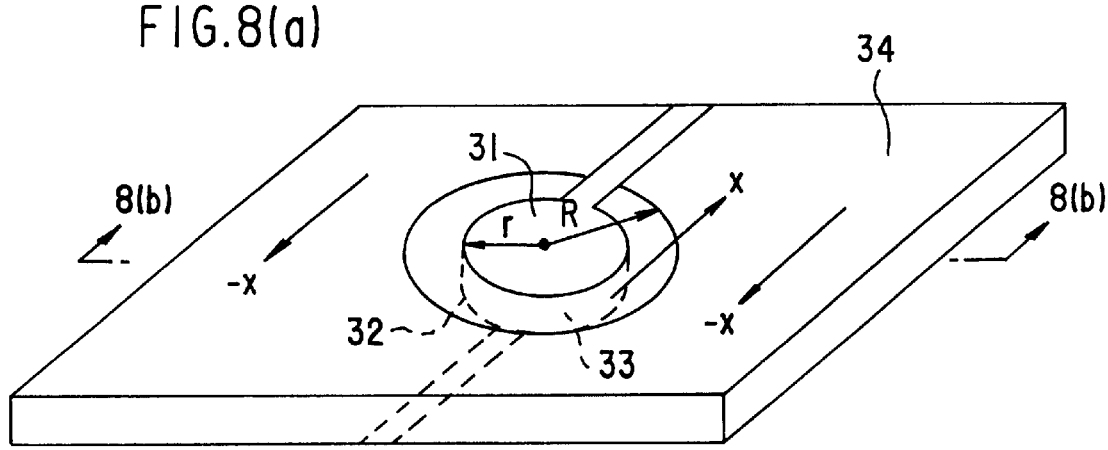
FIGS. 8(a) and 8(b) illustrate a third embodiment according to the present invention, with FIG. 8(a) being a perspective view, and FIG. 8(b) being a cross-sectional view along line 8(b)—8(b) in FIG. 8(a).
Figure 8B:
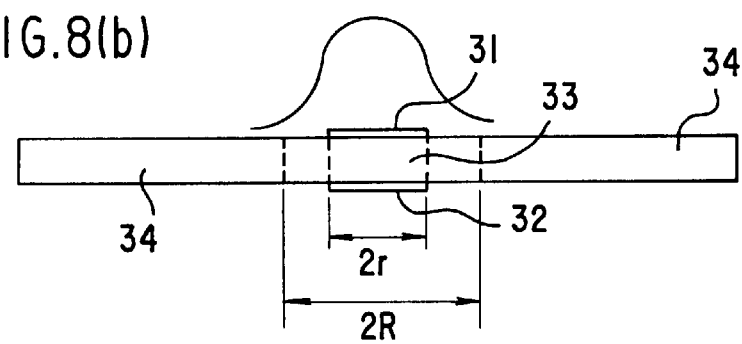

FIGS. 8(a) and 8(b) are drawings illustrating a third embodiment according to the present invention, where FIG. 8(a) shows a perspective view, and FIG. 8(b) shows a crosssectional view along line 8(b)—8(b) in FIG. 8(a).

The crystal oscillator according to the present embodiment differs from the crystal oscillator according to the above-described first and second embodiments in that excitation electrodes 31 and 32 with a radius r are formed on both planes of the crystal substrate 1 so as to form an excitation portion 33 of the disc-shaped portion defined between these electrodes 31 and 32, and an axis inversion portion 34 possessing an electrical axis (-X) opposite to the electrical axis (X) of the excitation portion 33 is formed adjacent to the excitation portion 4 in the periphery thereof with a radius R.

Just as with the above-described first and second embodiments, the crystal oscillator according to the present invention is capable of compensating the temperature properties of the excitation portion 33 by means of the afore-mentioned axis inversion portion 34, and consequently, a stable resonance frequency can be obtained even under conditions of ambient temperature fluctuation by means of a relatively simple temperature compensation circuit.

Figure 9:
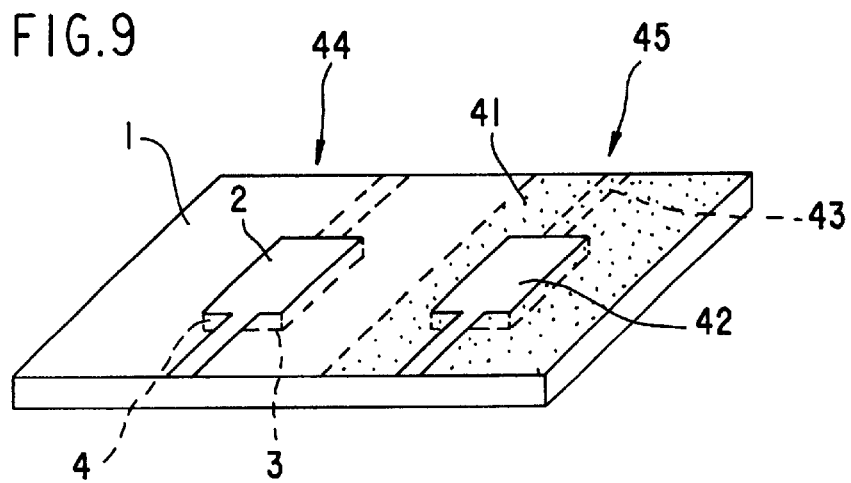
FIG. 9 is a perspective view of a crystal oscillator provided with a temperature sensor according to a fourth embodiment of the present invention.

FIG. 9 is a perspective view of a crystal oscillator provided with a temperature sensor according to a fourth embodiment of the present invention. FIG. 9 shows an axis inversion portion 41 possessing an electrical axis (-X) opposite to the electrical axis (X) of the excitation portion 4, the axis inversion portion 41 being formed within the crystal substrate 1 and adjacent to the excitation portion on one side thereof. Excitation electrode portions 42, 43 are located on the axis inversion portion 41.

This crystal oscillator provided with a temperature sensor is formed of an AT-cut crystal substrate 1 subjected to partial axis inversion treatment, thus forming oscillators of both the non-inverted portion and the inverted portion. The oscillator 44 of the non-inverted portion serves as a normal AT-cut crystal oscillator, and the oscillator 45 of the inverted portion serves as a -35° 15' RY-cut oscillator, thus acting as a temperature sensor having a temperature coefficient of +29 ppm/deg.

Figure 10:
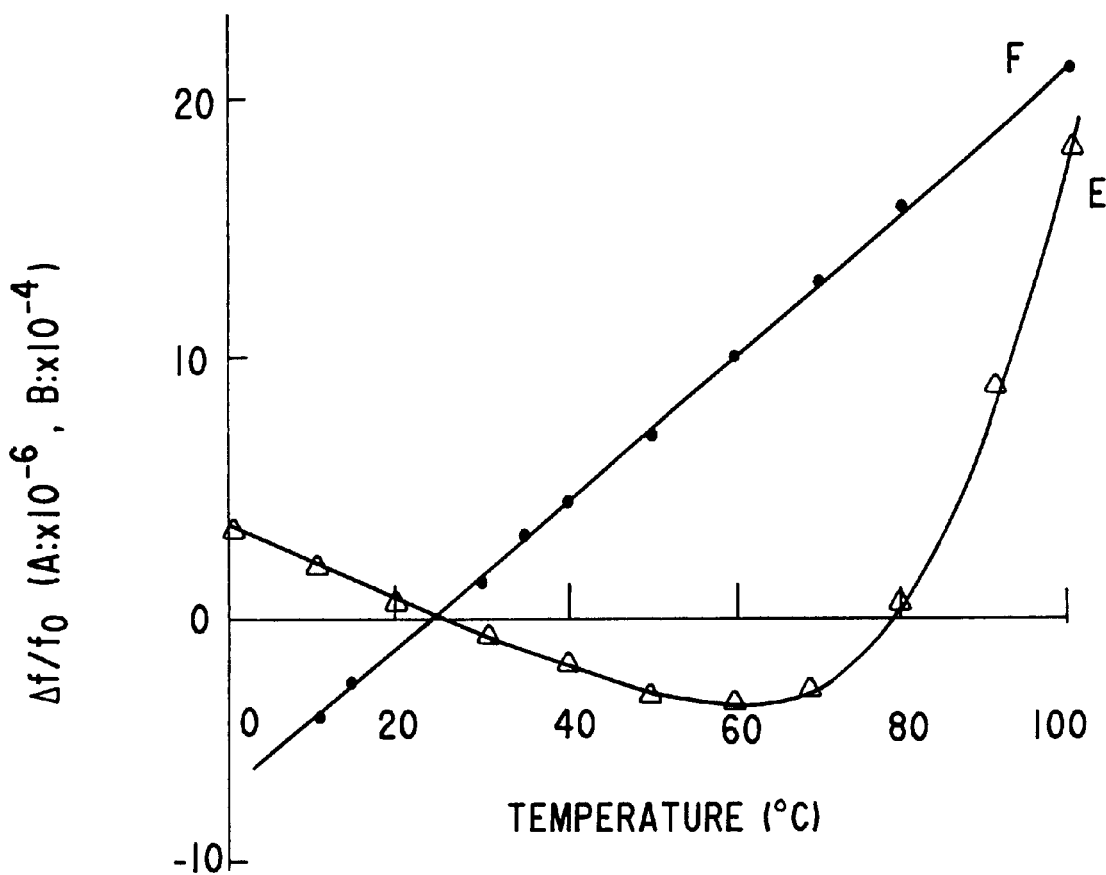
FIG. 10 is a graph illustrating the resonance frequency/temperature properties of the crystal oscillator provided with a temperature sensor according to a fourth embodiment of the present invention.
Figure 11:
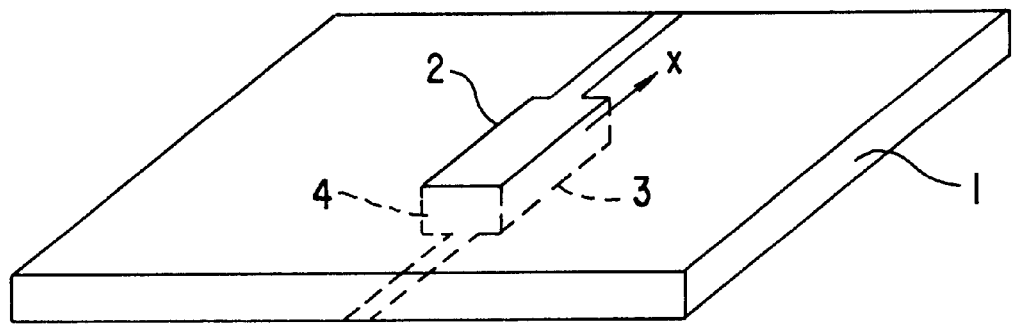
FIG. 11 is a perspective view of a crystal oscillator of the prior art.

FIG. 10 illustrates the resonance frequency/temperature properties of the crystal oscillator provided with a temperature sensor according to the present invention. In FIG. 10, E represents the properties of the non-inverted portion, and F represents the properties of the inverted portion.

As can be clearly understood from FIG. 10, the resonance frequency of the non-inverted portion (E) is described by a curve of the third order, and exhibits negative temperature properties at around room temperature. On the other hand, the inverted portion (F) exhibits temperature properties of +29 ppm/deg. Accordingly, employing the inverted portion (F) as a temperature sensor allows for obtaining of temperature information of the crystal substrate 1 directly.

This crystal oscillator provided with a temperature sensor can also be applied to known crystal oscillators (TCXO).

Particularly, applying this oscillator to known crystal oscillators (TCXO) allows for direct obtaining of temperature information of the crystal substrate 1, thus enabling temperature compensation with a high degree of precision.

As described above, the present invention permits temperature compensation to be carried out by leaking a portion of the oscillation energy generated within the afore-mentioned excitation portion to the afore-mentioned axis inversion portion, and thus stable resonance frequency and filter frequency can be obtained even under conditions of ambient temperature fluctuation by means of a relatively simple temperature compensation circuit.

Thus, the extra electronic components additionally required to form the temperature compensating circuit for the known crystal oscillator (TCXO), and adjustment of the circuit of the crystal oscillator are unnecessary, whereby crystal oscillators and filters can be obtained which are easy to handle and inexpensive in cost.

Further, applying this crystal oscillator to portable-type wireless communication equipment enables reduction in the volume of mounted parts due to the reduction in the number of parts used, and other excellent effects can be obtained as well, such as reduction in electrical battery power consumption which allows for usage over long periods of time, and the like.

As also described above, the afore-mentioned axis inversion portion is formed adjacent to either one side or both sides of the excitation portion, so that temperature compensation is carried out more accurately by causing leakage of a portion of the oscillation energy generated within the afore-mentioned excitation portion to the afore-mentioned axis inversion portion.

As also described above, the axis inversion portion is formed in the periphery of the excitation portion, so that temperature compensation is, more accurately carried out by causing leakage of a portion of the oscillation energy generated within the afore-mentioned excitation portion to the afore-mentioned axis inversion portion.

As also described above, electrode portions for excitation are provided to the axis inversion portion so as to form a temperature sensor portion, so that the afore-mentioned axis inversion portion serves as a temperature sensor having temperature coefficients in a generally linear manner. Accordingly, applying this oscillator to known crystal oscillators (TCXO) allows for obtaining of temperature information of the crystal substrate directly, thus enabling temperature compensation with a high degree of precision.

As noted above, a crystal oscillator can be manufactured wherein stable resonance frequency and filter frequency can be obtained even under conditions of ambient temperature fluctuation, where the metal film is one of the following: Cr film, Ni film, or NiCr film, so that inversion of the electrical axis can be made to occur at temperatures far lower than the $\alpha$-$\beta$ transition temperature (540° to 550°).

The manufacturing method also includes a step where the thermal treatment is conducted within either an atmosphere of inert gas or within a vacuum, so that loss of stress of the metal film is dealt with by means of preventing oxidation of the afore-mentioned metal film, and thus formation of the axis inversion portion within the crystal substrate can be conducted in a more precise manner.

As can be understood from the above, a crystal oscillator and the manufacturing method thereof can be provided wherein a stable resonance frequency and filter frequency can be obtained even under conditions of temperature fluctuation by means of a relatively simple temperature compensation circuit, which is easy to handle and involves no complicated adjustment, and further wherein low costs can be realized.

What is claimed is:

1. A method for manufacturing a crystal oscillator, including a crystal substrate and electrode portions for excitation formed on either face of said crystal substrate so as to form an excitation portion in the area defined between said electrode portions, said manufacturing method comprising:
    a first step of forming metal films on opposite sides of said excitation portion on one surface of said crystal substrate for excitation;
    a second step of subsequently subjecting said crystal substrate to thermal treatment at a temperature equal to or lower than the $\alpha$-$\beta$ transition temperature of the crystal, thereby forming within said crystal substrate an axis inversion portion processing an electrical axis opposite to the electrical axis of said excitation portion; and
    a third step of forming said electrodes portions on opposite surfaces of said crystal substrate after the first step of forming the metal films, thereby defining the areas containing said excitation portion.

2. A method for manufacturing a crystal oscillator according to claim 1, wherein said metal film is a Cr film, an Ni film or an NiCr film.

3. A method for manufacturing a crystal oscillator according to claim 1, wherein said thermal treatment is conducted in an atmosphere of inert gas.

4. A method for manufacturing a crystal oscillator according to claim 1, wherein said thermal treatment is conducted in a vacuum.

5. The method for manufacturing a crystal oscillator as recited in claim 1, further comprising a fourth step of removing the metal films formed in the first step.

* * * * *